United States Patent [19]
Takeuchi et al.

[11] Patent Number: 5,966,521
[45] Date of Patent: Oct. 12, 1999

[54] SYSTEM AND METHOD FOR ANALYZING STATIC TIMING

[75] Inventors: Hideki Takeuchi; Mototaka Kuribayashi; Junichi Tsujimoto; Kentaro Kuroiwa; Yasuhiro Tonooka, all of Kanagawa-ken, Japan

[73] Assignee: Kabushiki Kaisha Toshiba, Kawasaki, Japan

[21] Appl. No.: 08/853,908

[22] Filed: May 9, 1997

[30] Foreign Application Priority Data

May 10, 1996 [JP] Japan .................................. 8-116601

[51] Int. Cl.$^6$ .................................................. G06F 17/50
[52] U.S. Cl. ................................... 395/500.07; 395/500.4
[58] Field of Search ................................. 364/488, 489, 364/490, 491, 578; 395/500.07, 500.4

[56] References Cited

U.S. PATENT DOCUMENTS

| | | | |
|---|---|---|---|
| 5,355,321 | 10/1994 | Grodstein et al. | 364/489 |
| 5,648,909 | 7/1997 | Biro et al. | 364/488 |
| 5,650,938 | 7/1997 | Booteh Saz et al. | 364/490 |
| 5,675,728 | 10/1997 | Kunda et al. | 395/183.04 |

*Primary Examiner*—Kevin J. Teska
*Assistant Examiner*—Leigh Marie Garbowski
*Attorney, Agent, or Firm*—Foley & Lardner

[57] ABSTRACT

The present invention provide a system and a method for analyzing the static timing for LSIs which involves rather a small number of false paths contained in output results and also which reduces the processing time required. A static-timing analysis technique according to the present invention comprises a net-list input step S110 which inputs per-transistor basis connection information, to construct an internal data structure for analysis; an expected-value check step S120 which checks, against the above-mentioned internal data structure, each node on whether its expected values may be a high-impedance state; a signal-flow direction narrow-down step S130 which narrows down the directions in which the transistor signal may flow, based on the obtained expected values; a division step S140 which divides a sequential circuit into units consisting of only combinational sub-circuits; a path search step S150 which searches paths for each of thus divided units; and an output step S170 which outputs the obtained results.

17 Claims, 13 Drawing Sheets

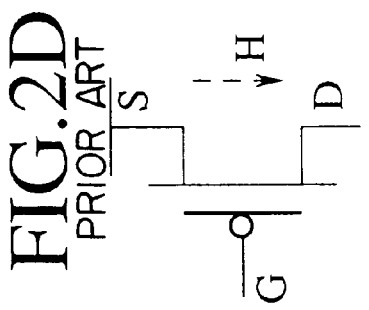
FIG.2A PRIOR ART
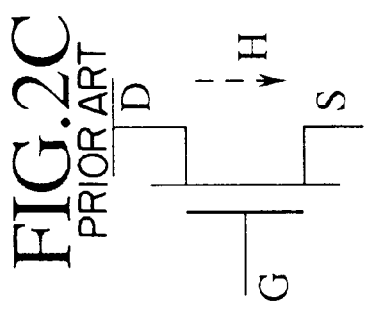
FIG.2B PRIOR ART
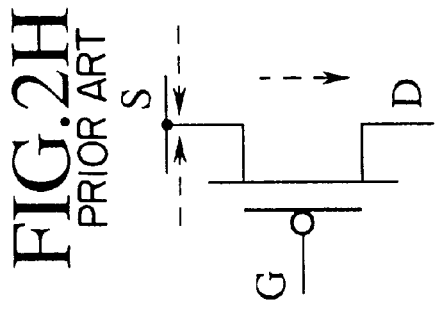
FIG.2C PRIOR ART
FIG.2D PRIOR ART
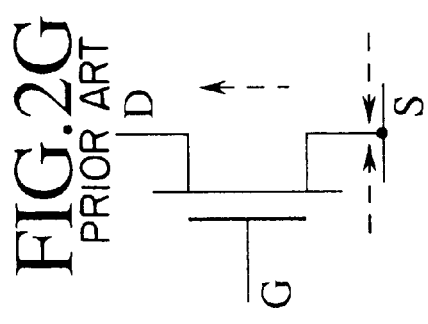
FIG.2E PRIOR ART
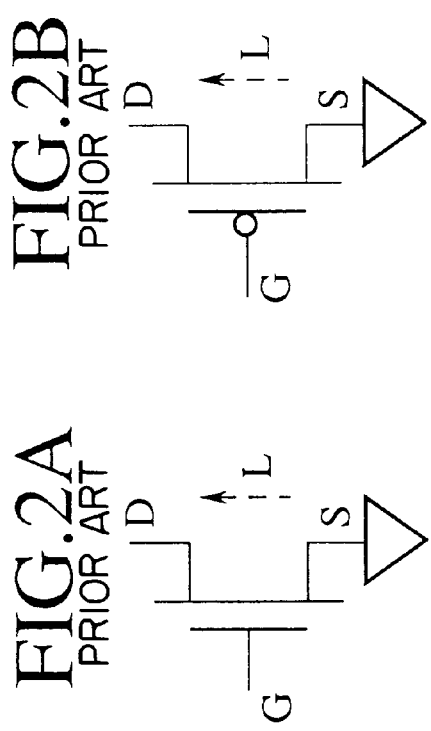
FIG.2F PRIOR ART
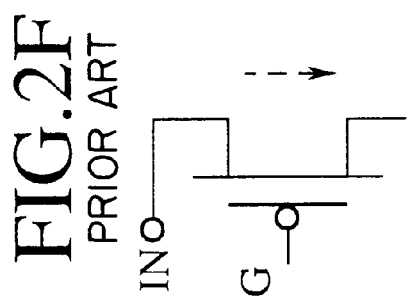
FIG.2G PRIOR ART
FIG.2H PRIOR ART
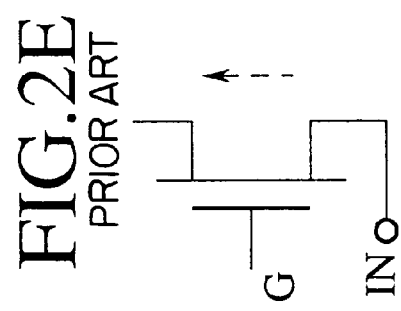

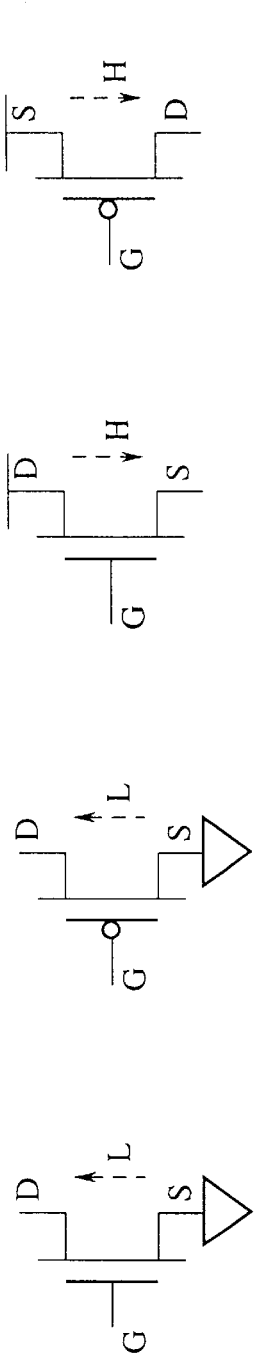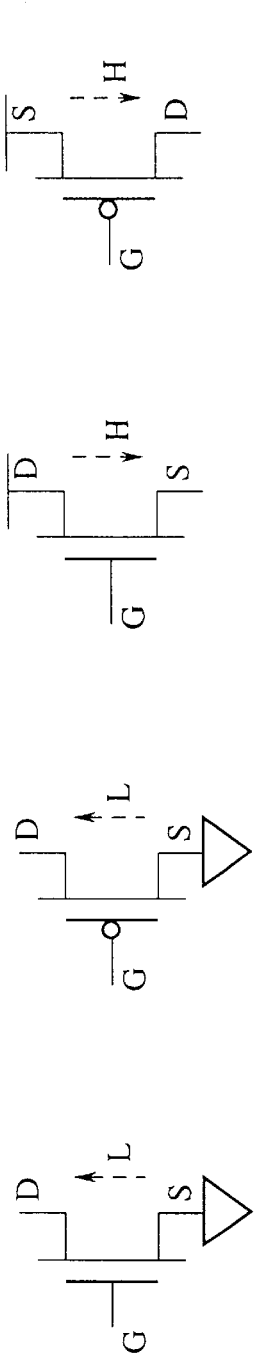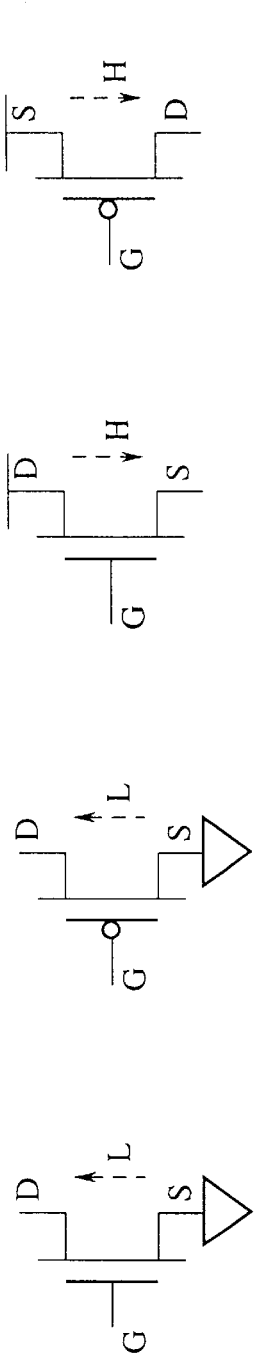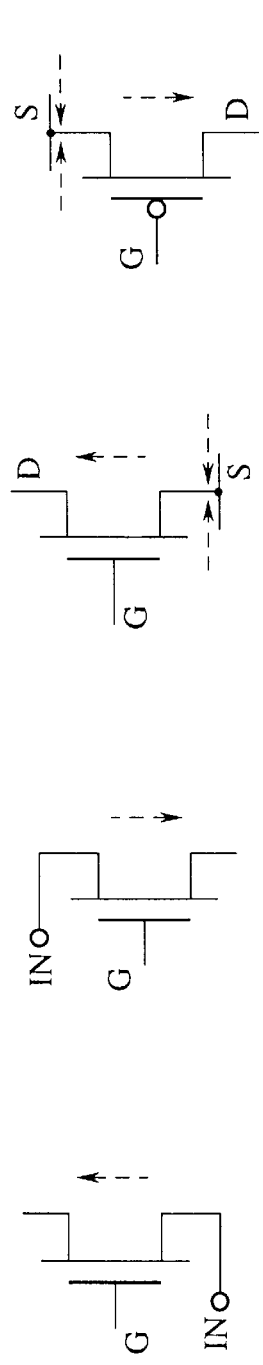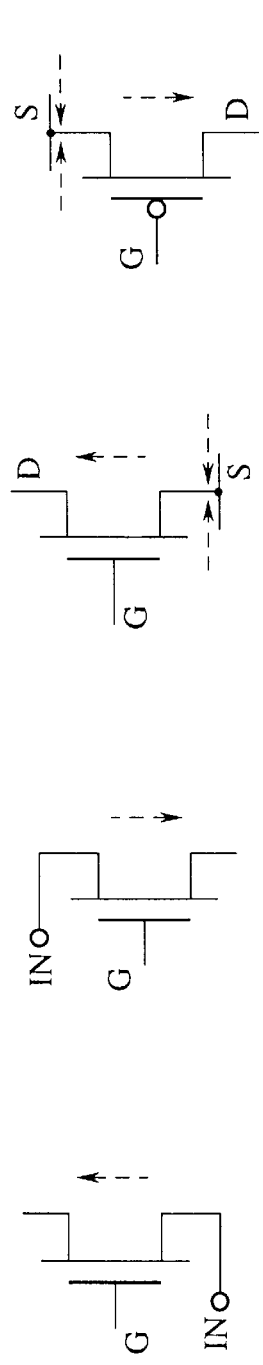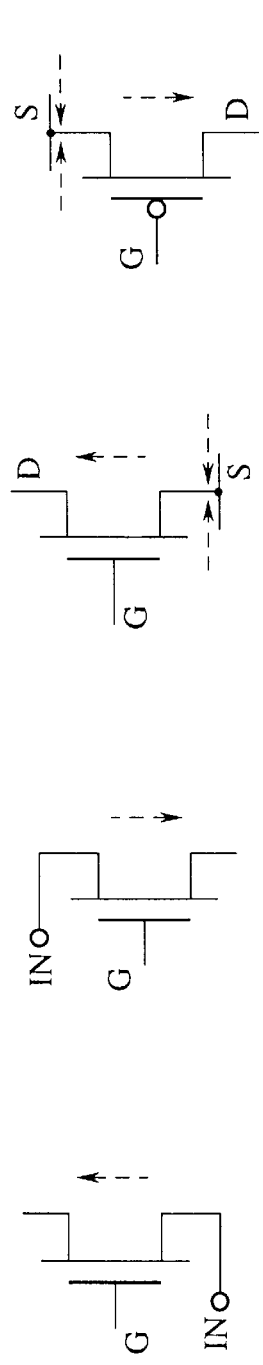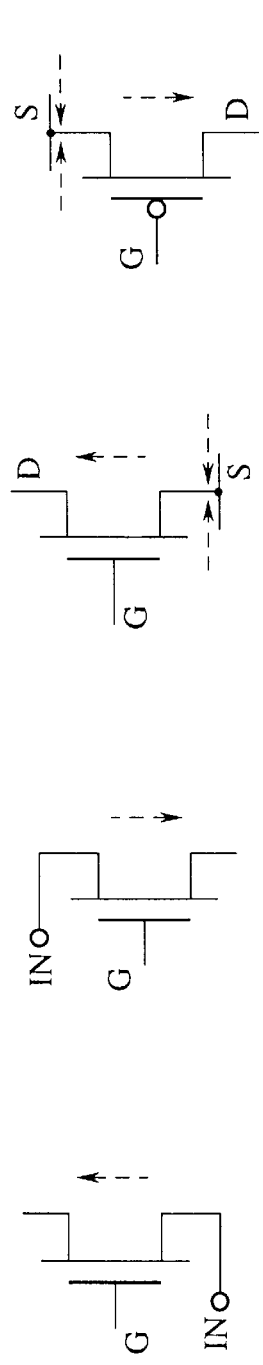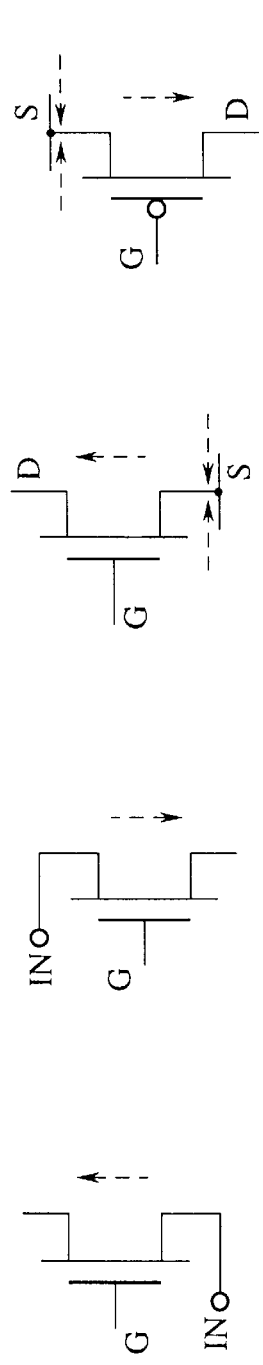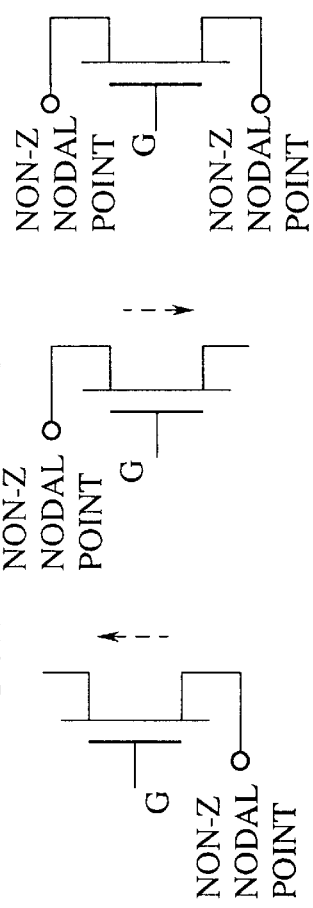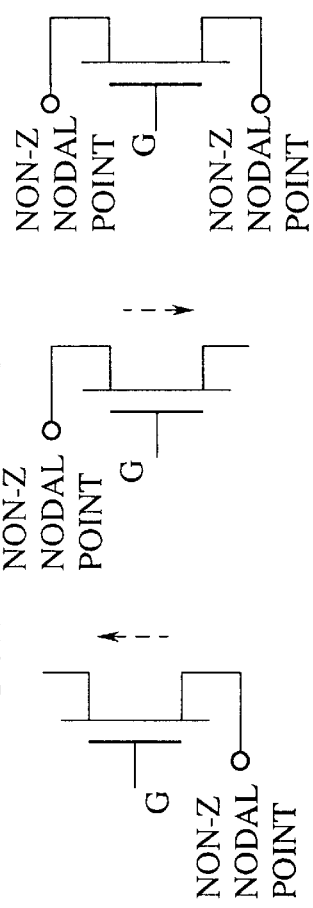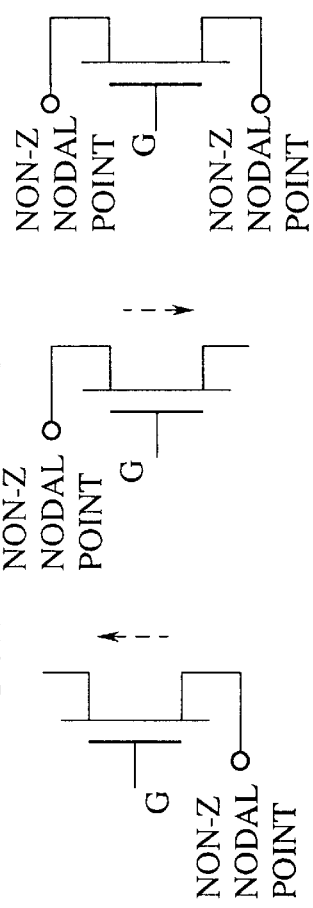
FIG.12A FIG.12B FIG.12C FIG.12D
FIG.12E FIG.12F FIG.12G FIG.12H
FIG.12I FIG.12J FIG.12K

SYSTEM AND METHOD FOR ANALYZING STATIC TIMING

BACKGROUND OF THE INVENTION

1. Field of the Invention

The present invention relates in general to a system and a method for analyzing the static timing for LSIs and more particularly to a system and a method for analyzing the static timing for searching circuits for their critical paths based on the information of transistor connections.

2. Description of the Prior Art

Recently the number of transistors merged in an LSI has drastically increased, accompanied by the ever increasing complexity of the circuits of logic LSIs represented by, in particular, microprocessors. Presently, to design and manufacture semiconductor devices, it is indispensable to employ CAD systems, which help improve the circuit performance and reduce the time required to fabricate them. To achieve this purpose is available such a static-timing analysis technique as PathMill, which searches circuits for their critical paths based on the transistor-connection information. This static-timing analysis technique has rapidly pervaded the industry because it is speedy in analysis and does not require combinational strings (hereinafter called test vectors) of input signals. This technique is proposed for use in various types of static-timing analysis systems such as those which analyze the circuits for each inverter, NAND gate, and other gate and those which do so for each transistor. Moreover, various types of algorithms are proposed for searching for the paths. Various types of algorithms are also available for use in the per-transistor basis static-timing analysis technique. FIG. 1 shows an example of flowchart for processing executed by a conventional static-timing analysis system. This per-transistor basis static-timing analysis system searches for, based on the transistor-connection information, the paths having the largest delay out of those which the signals come from or go out.

First, the analysis system reads in a net list to construct an internal data structure (step S1). To carry out a per-transistor basis analysis, the system generally expands the hierarchical structure, thus providing an overall flat condition. Next, according to the rules described later, the analysis system narrows down the transistor signal-flow directions (step S2). This enables the efficient performing of the subsequent path search. Then, the analysis system, based on the clock-signal nodes specified by the user, divides all the sequential circuits into blocks of the circuits composed of only combinational sub-circuits (step S3). The subsequent processes are all carried out for each of those blocks. Then, the paths are searched for (step S4). The system first searches for paths as assuming one of the incoming signals to be a high-to-low changing signal and then does so as assuming it to be a low-to-high changing signal, thus finding the possible longest paths. The system repeats this process for each of the other incoming signals, to find the critical paths of a desired circuit. The paths can thus be searched for by repeating a process of assumption and verification for the signal flow to trace the propagation of the signal. When having completed the process of path searching for all the blocks (step S5), the system outputs the results (step S6).

Step S2 mentioned earlier for the narrowing down of transistor signal flow directions is described as follows. A MOS transistor, originally a four-terminal element, is thought of as a three-terminal element in which the substrate terminal is generally ignored in the static-timing analysis method. Assume here that in an NMOS transistor shown in FIG. 2(a) a logically positive value (power supply potential) is applied to the terminal G and the terminal D is connected to a grounded capacitor so that a current I would flow from the terminal D through the terminal S if the terminal S is grounded. This condition is here defined as a state where, as shown in FIG. 2(a), a low-level signal is propagated from the terminal S through the terminal D. Likewise, if, in a PMOS transistor shown in FIG. 2(d), the terminal G is grounded and the terminal D is connected to a grounded capacitor, a current I would flow from the terminal S through the terminal D when a logically positive value (power-supply potential) is applied to the terminal S. This condition is defined as a state where, as shown in FIG. 2(d), a high-level signal is propagated from the terminal S through the terminal D. Likewise, as shown in FIGS. 2(b) and 2(c), the signal flow directions through the PMOS and NMOS transistors respectively are determined. Originally, it cannot be known in which directions of the source and drain terminals the signal flows in MOS transistors; however, when either one of these two terminals is grounded or connected to a power-supply potential, the direction in which the signal flows through the transistor is limited to one.

In the case where, as shown in FIG. 2(e), an incoming signal indicated by IN is connected to the source terminal of the NMOS transistor, this signal can only either be a high level (connected to the power-supply potential) or a low level (grounded), so that the signal flow is limited in the arrow direction shown in the figure. Likewise, in the case of the PMOS transistor such as shown in FIG. 2(f), the signal flow is limited in the arrow direction in the figure. Also in the case of the NMOS transistor such as shown in FIG. 2(g), in which it cannot be known in which direction a signal would flow at its terminal S, when the same signal comes from all portions connected thereto, the signal flow can be limited in the arrow direction shown in the figure. Likewise, in the case of the PMOS transistor such as shown in FIG. 2(h) also, the signal-flow direction can be limited.

By utilizing those rules, it is possible to narrow down the signal-flow directions for those transistors which are connected to the transistor whose direction is already narrowed down.

Next, at the step S3 where a sequential circuit is divided into a number of blocks, the sequential circuit is actually divided into a number of combinational-circuit blocks if possible.

Then, the algorithm for the path search step S4 is described as follows. As mentioned earlier, this step searches the circuit from the arrival of a particular incoming signal considered to have changed from a high state to a low state through its leaving as an outgoing signal for the possible longest path from the viewpoint of circuit operations. The system carries out this type of search operation for each incoming signal in both cases where it has changed from a high state to a low state and vice versa, to find the longest path from among those searched at this step.

Note that generally every transistor in a circuit is taken to be a linear resistor, in calculation of the propagation delay time, so that its apparent resistance may be multiplied by a stray capacitance in approximation to the RC product as a time constant, and the description of how to do so is omitted here. The following description does not cover details of delay time calculation, assuming that each inter-node delay is already calculated.

The path search operation concerns two states of each node: the one before change and the other after it. The state before change refers to the one before the incoming signal changes and the state after change, the one after the changed input signal has influenced all the elements of a particular circuit.

Assume here that such a state is propagated from one ode to the next one. Such a situation is called a sequential search. Even this single assumption premises several new assumptions as necessary conditions. Here, the condition for nodes required to be directly influenced by a changed node is called a direct condition. Also, the condition for a particular node required to establish its own direct condition so that all the transistors connected thereto are taken into account is called an indirect condition. Such a change in state of a node shifts to its adjacent one. Thus one assumption gives birth to several new assumptions, each of which then produces different new assumptions, so that the assumption pervades the adjacent nodes one by one. The system continues this assumption until it reaches a node which has a power supply, ground, incoming signal, outgoing signal, or other special attribute or a node beyond which the sequential search is no longer possible, thus deciding whether the assumption is true or false. When an assumption is decided to be false, i.e. is denied, the system returns to that denial point in time to correct both that assumption and the dependent ones. Thus, each of the direct and indirect conditions needs to be traced back until its own assumption is confirmed to be true. This operation is called a backward search. Thus, the system repeats a forward search, to cover the paths of each signal from its entering through leaving.

In such a way as described above, the system stores paths thus obtained for each block and does it store the path having the largest delay in a file or displays on a CRT screen.

If, in this process, the transistor signal flow is properly directed, a conflict in a particular assumption of path search would ignore a smaller number of assumptions accumulated theretofore than otherwise. This enables reducing the time for processing. Also, an appropriate directing of the transistor signal flow would also decrease the number of false paths, i.e. those paths which are impossible from the viewpoint of circuit operations, because of an accumulation of false assumptions.

A prior art is described below based on the analysis of a test circuit prepared for evaluation.

Here, how to analyze a circuit conventionally called a barrel shifter is described. The barrel shifter will execute shift operations at a high speed in microprocessors etc. FIG. 3 shows a portion of the barrel shifter circuit. As shown in the figure, the barrel shifter employs a lot of transmission gates.

First the processing directs, based on the above-mentioned rules, the signal flow only for the transistors that make up the inverter and not for those transistors that make up the transmission gate.

Therefore, the path-search process would search for such a path as indicated by a broken-line arrow in FIG. 3, i.e. a path which is impossible circuit operation-wise, the verification of which may greatly elongate the processing or may output false paths.

Next, FIG. 4 shows a flowchart for the prior art. This example, instead of narrowing down the transistor signal-flow directions, carries out pattern matching to converts path search from a per-transistor basis to a per-gate basis. There are various types of pattern matching techniques available, but their description is omitted here.

Those techniques, however, cannot determine the direction in which the transmission gate signal such as shown in FIG. 3 would flow and therefore may give false paths or greatly increase the processing time as mentioned above.

As can be seen from this, the prior art suffers from a poor ratio of determining the direction in which the transistor signal would flow in such a circuit as having a lot of path transistors, so that a lot of false paths will be given in the analysis results accompanied by a greatly long processing time.

SUMMARY OF THE INVENTION

As worked out to solve those problems, the present invention provides a system and a method for analyzing the static timing whereby it is possible to reduce false paths contained in the analysis results and also to decrease the processing time.

To achieve this object, a static-timing analysis system according to the present invention comprises net-list input means which inputs per-transistor basis connection information to construct an internal data structure for analysis; expected-value check means which extracts nodes whose expected value cannot be a high-impedance state from among those contained in the above-mentioned internal data structure; signal-flow direction narrow-down means which narrows down the directions in which the transistor signal may flow, based on the information obtained at the above-mentioned expected-value check means; division means which divides each sequential circuit into block units consisting of only combinational sub-circuits; path search means which searches paths for each of those divided units; and output means which outputs thus obtained results.

Also, a static-timing analysis method according to the present invention includes a net-list input step which inputs per-transistor basis connection information to construct an internal data structure for analysis; an expected-value check step which extracts the nodes whose expected value cannot be a high-impedance state from among those contained in the above-mentioned internal data structure; a signal-flow direction narrow-down step which narrows down the directions in which the transistor signal would flow based on the information obtained at the above-mentioned expected-value check means; a division step which divides sequential circuit into a number of block units consisting of only combinational sub-circuits; a path search step which searches paths for each of those divided units; and an output step which outputs the results thus obtained.

According to one embodiment of the present invention, above-mentioned expected-value check means comprises element search means which searches all elements whose source or drain is linked with a prescribed node; conflict decision means which decides whether or not a conflict is encountered if it is assumed that all of those elements thus searched are rendered non-conducting simultaneously; and direction narrow-down node authorization means which authorizes that each of the nodes decided to be conflicting cannot be of a high-impedance state.

According to another embodiment, the above-mentioned conflict decision means decides whether or not a conflict may be encountered, by further increasing the number of verification steps on those nodes already decided to be non-conflicting when it is assumed that the elements searched as mentioned above are all rendered non-conducting simultaneously.

According to a further embodiment, the above-mentioned conflict decision means discontinues verification at the second or third step in deciding whether or not a conflict is encountered by further increasing the number of verification steps.

According to a still further embodiment, the above-mentioned signal-flow direction narrow-down means will narrow down the directions only for those nodes which will not be of a high-impedance state for the relevant transistor.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 2A–2H show the rules of narrowing down the transistor signal-flow directions according to the conventional example;

FIGS. 12A–12K show the rules of narrowing down the transistor signal-flow directions according to the embodiment;

DETAILED DESCRIPTION OF EMBODIMENTS

Various embodiments of the system and the method for static-timing analysis relating to the present invention will be described with reference to the accompanying drawings.

Figure 5:
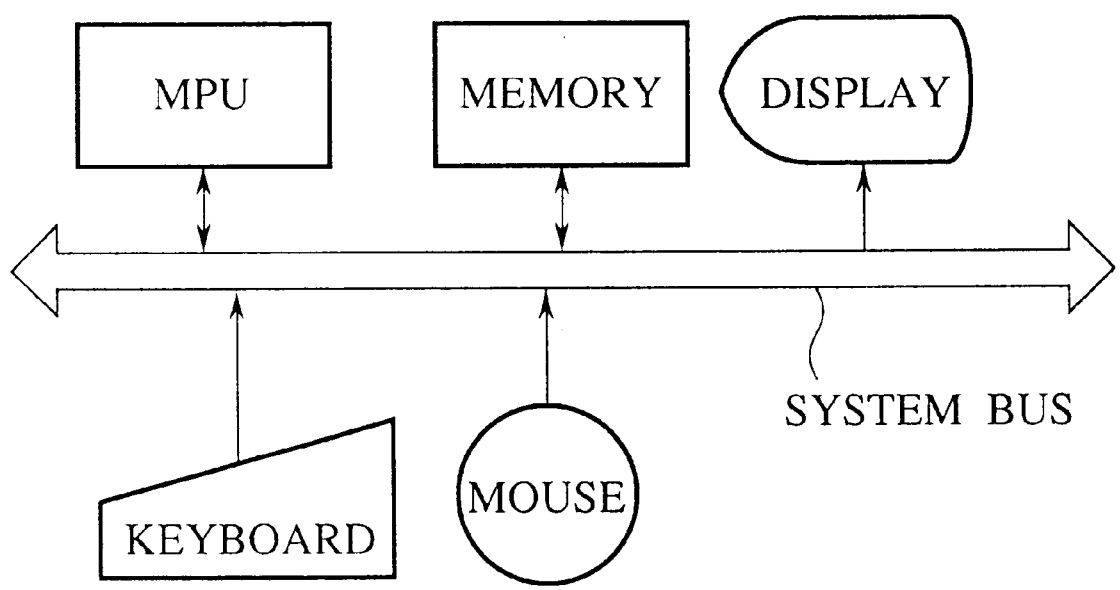
FIG. 5 is a block diagram of a static-timing analysis system according to the present invention.

As the hardware construction of a static-timing analysis system relating to the present invention, a usual computer system may be employed which comprises, as shown in FIG. 5, an MPU which executes processes at various steps described below; a keyboard, mouse, light pen (not shown), flexible disk unit (not shown), or other input device; a memory unit, disk unit (not shown), or other external storage device; and a display unit, printer (not shown), or other output device. Note here that the above-mentioned MPU comprises the Arithmetic/Logical Unit (ALU) which executes processes at various steps described below and the main storage unit, which stores the instructions used in those processes.

Figure 6:
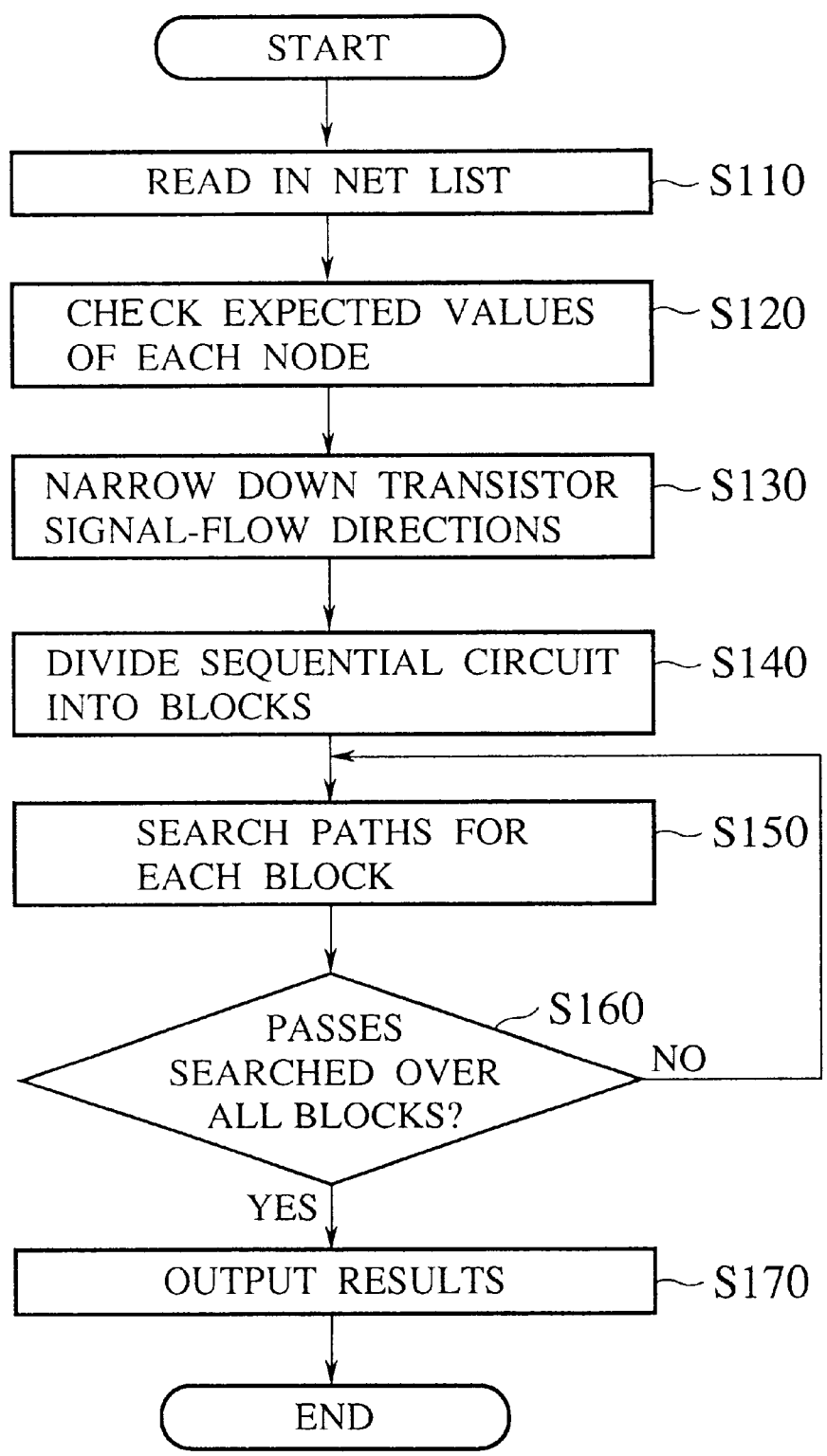
FIG. 6 is a flowchart of an embodiment of static-timing analysis method relating to the present invention.

FIG. 6 shows a flowchart illustrating the processing by a static-timing analysis system according to the embodiment.

First the system, in the same way as the conventional example, reads in a net list to construct an internal data structure (step S110). Generally, to carry out analysis on a per-transistor basis, the system expands the hierarchical structure to provide an overall flat state. Next, the system checks the possible values of each node, to decide whether each node can be of a Z state, i.e. a high-impedance state (step S120). Then, based on the rules described later, the system narrows down the directions in which the transistor signal flows (step S130). Thus, the system can efficiently carry out path search described later. Next, based on clock-signal nodes specified by the user, the system divides each sequential circuit into circuit blocks consisting of only combinational sub-circuits (step S140). Then, the system searches paths for each of those blocks (step S150). When having finished path search for all the blocks (step S160), the system outputs the results. (step S170)

Here, the process by the step S120 of checking expected values of each node is described below. This process is hereinafter called a "non-Z node check". This process would, as mentioned earlier, check whether each node can be of the Z (high-impedance) state or not.

The basic principle of this process is "if a node which has been assumed to be of the Z (high-impedance) state encounters a conflict, it cannot be of the Z (high-impedance) state."

Figure 7:
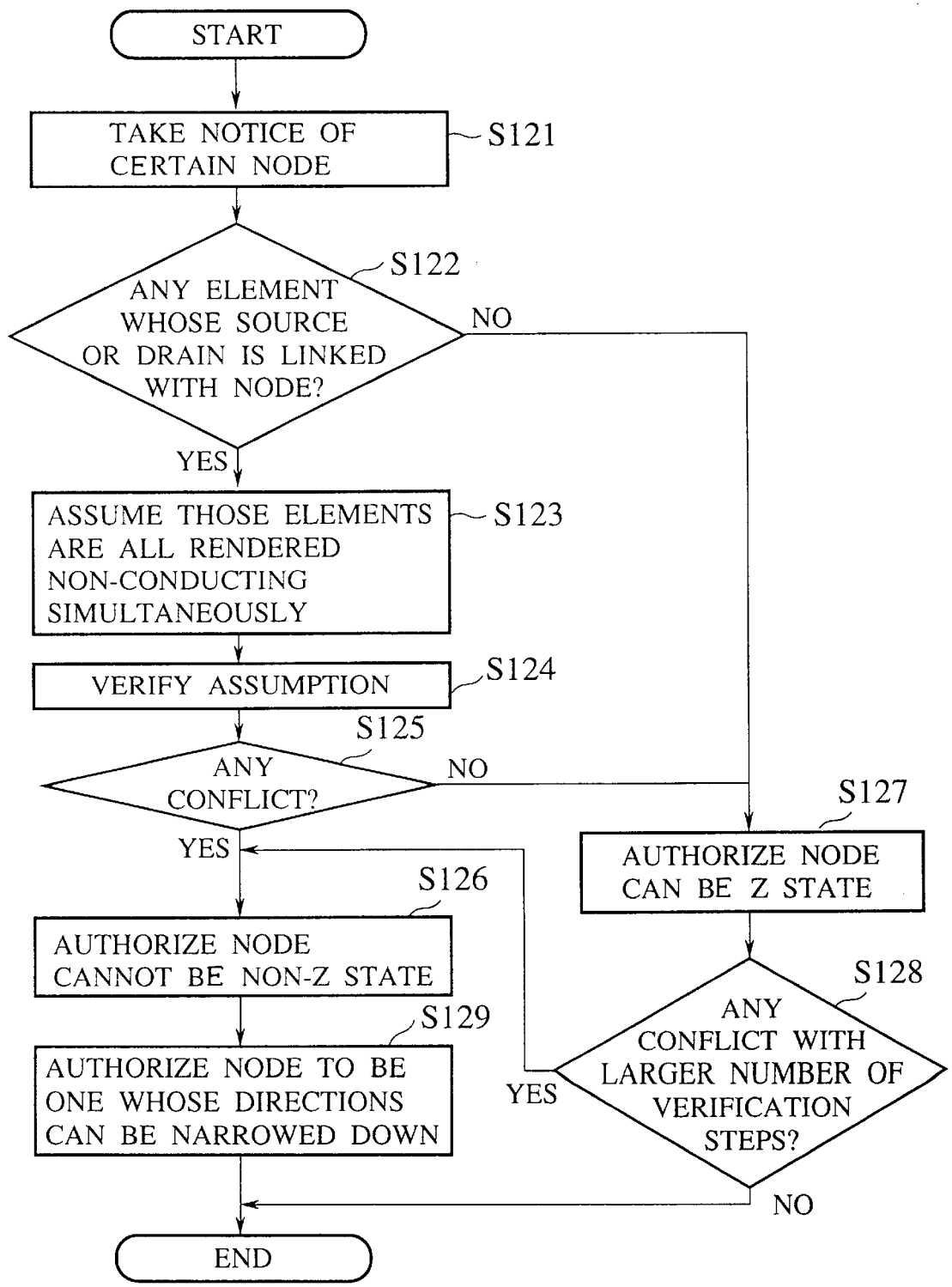
FIG. 7 is a flowchart illustrating the process by the step S120 which checks the expected value of each node according to the embodiment.

FIG. 7 shows a flowchart for this process. This process is described according to this flowchart. First, the process takes up a given node (step S121) and searches for every transistor whose source or drain is linked with this node (step S122). Then, if none of such transistors is found, the system authorizes this node to be the one that can be of the Z state (step S127), and, otherwise, assumes that those transistors are rendered non-conducting simultaneously (step S123). In order to be rendered non-conducting, an NMOS transistor needs either to have its gate connected to a low state or to have the other transistor's channel placed in the X state, while a PMOS transistor needs either to have its gate connected to a high state or to have the other transistor's channel placed in the Z state. To verify this assumption, the process further accumulates necessary assumptions for the nodes of the gates, drains, and sources linked with each of these transistors and then further verifies those assumptions (step S124). This process is just similar to the backward search in the above-mentioned path search.

Next, the process decides whether this verification encounters a conflict (step s125). If a conflict is encountered, the process decides that the node cannot be of the Z state, which is hereinafter called a non-Z node. If this assumption encounters no conflict until the verification is finished, the process decides that the node can be of the Z state (step S127). In this case, the process increases the number of verification steps to further decide whether any conflict is encountered (step S128). To carry out verification completely, the process must continue the backward search until it finds all the nodes that have a power supply, ground, input signal, output signal, or other special attribute; this operation however requires rather a long time, so that the verification may be discontinued with an appropriate number of steps. By experience, fair results can be obtained with two or three steps.

Figure 8:
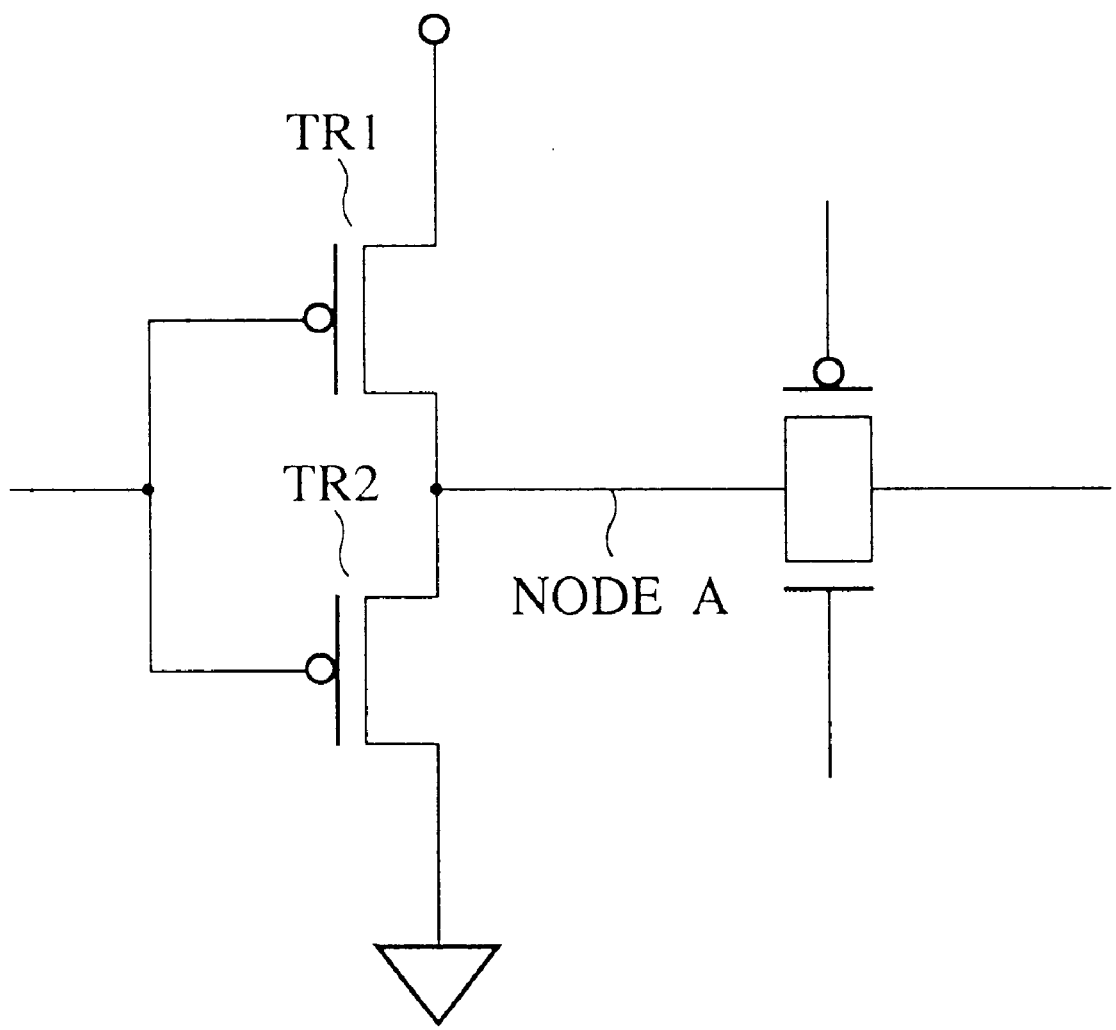
FIG. 8 is a circuit diagram describing an exemplification for verifying assumptions.

An exemplification of this verification is described with reference to the drawings. First the system carries out verification on node A in a circuit shown in FIG. 8. On the left side of the node A in the figure as viewed from you, you can see that the drain of a PMOS transistor TR1 and the source of an NMOS transistor TR2 are interconnected.

Assume that these transistors are all rendered non-conducting simultaneously. The system verifies this assumption, to know that those transistors cannot be rendered non-conducting simultaneously because their gates are interconnected. Therefore, the system thus finds a conflict, to decide that the node A cannot be of the Z state.

Figure 9:
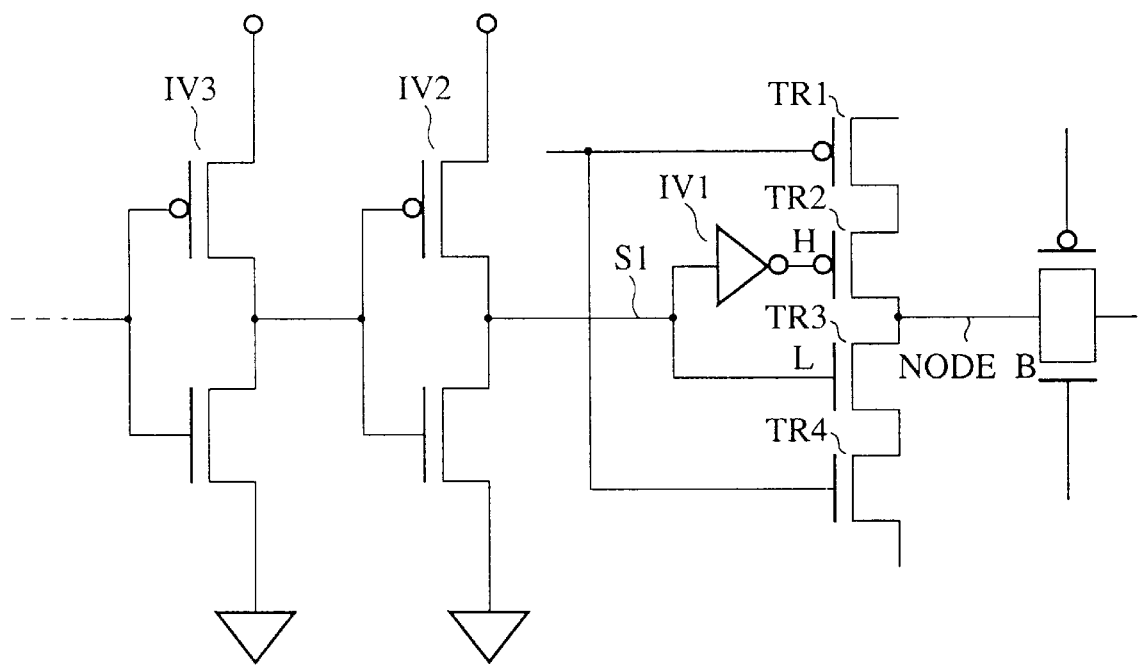
FIG. 9 is a circuit diagram describing another exemplification for verifying assumptions.

Next, the system carries out verification on a node B in a circuit shown in FIG. 9. On the left side of the node B as viewed from you, you can see that PMOS transistors TR1 and TR2 and also NMOS transistors TR3 and TR4 are connected in series. Out of those transistors, the inner transistors TR2 and TR3 are both assumed to be rendered non-conducting simultaneously. The system verifies this assumption, to know that these two transistors may be rendered simultaneously if a signal S1 is set at a low state, which enters the TR2's gate via an inverter IV1 and, at the same time, directly enters the TR3's gate. Therefore, at this step, the system finds no conflict and authorizes that the node B can be of the Z state. Next, the system increases the number of verification steps and takes notice of the point from which the signal S1 is sent from. At this point an inverter IV2 is connected, so that the signal S1 may be of a low state if a signal S2 is at a high state. At this step, therefore, the system authorizes that the node B can be of the Z state. Then, the system further increases the number of verification steps, to take notice of the point from which a signal S2 is sent out. At this point, an inverter IV2 is connected, so that the signal S2 may be of a high state if a signal S3 is at a low state. Also at this step, therefore, the system authorizes that the node B can be of the Z state. If no conflict is encountered even when the number of verification steps is further increased, the system authorizes that the node B can be of the Z state, to go to the next node and verify it.

Figure 10:
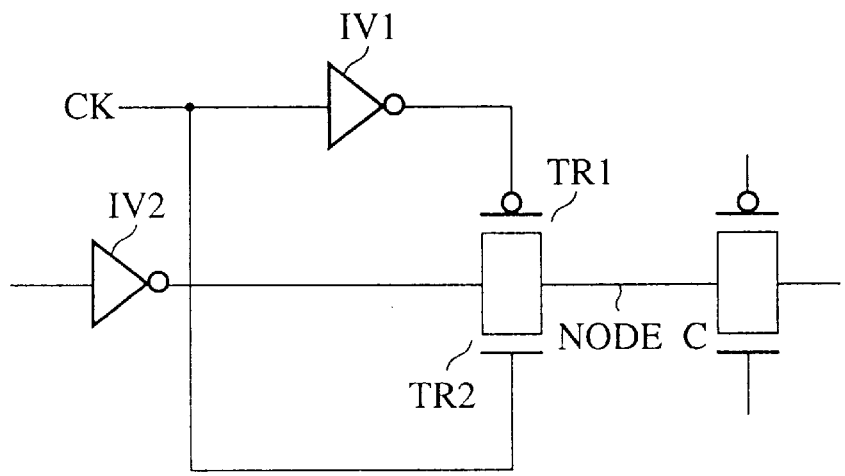
FIG. 10 is a circuit diagram describing a further exemplification for verifying assumptions.

Next, the system verifies a node C in a circuit shown in FIG. 10. On the left side of the node C in the figure as viewed from you, you can see that the drain of a PMOS transistor TR1 and that of an NMOS transistor TR2 are interconnected. Assume that these transistors are both rendered non-conducting simultaneously. The system verifies this assumption, to know that they both can be rendered non-conducting simultaneously because a clock signal CK enters the TR1's gate via an inverter IV1 and, at the same time, enters the TR2's gate directly. The system, therefore, authorizes that the node C can be of the Z state.

Figure 11:
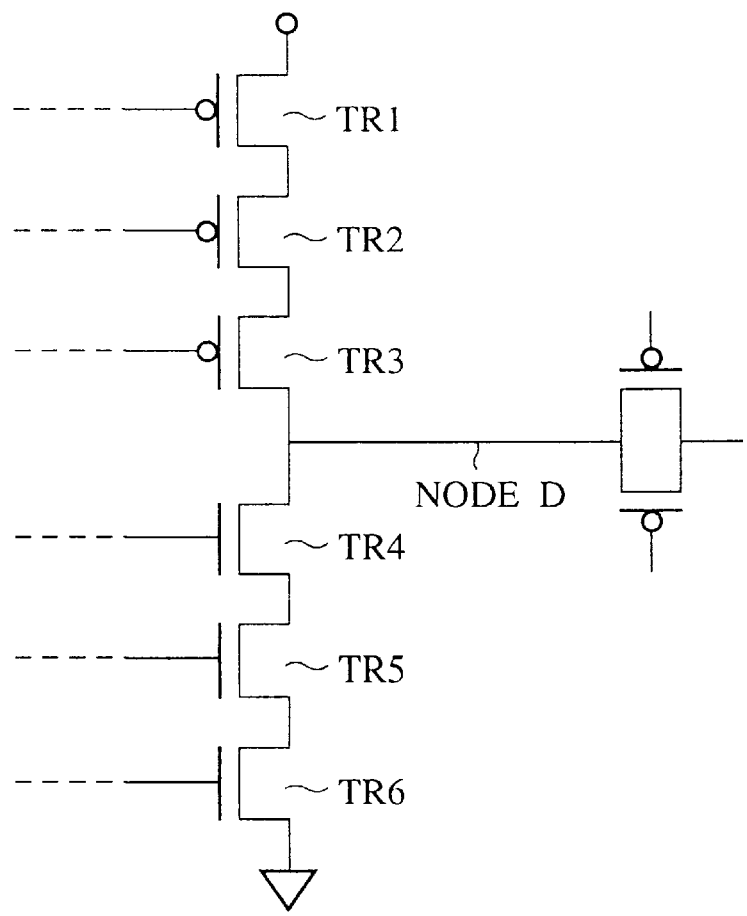
FIG. 11 is a circuit diagram describing a still further exemplification for verifying assumptions.

Then, the system verifies a node D in a circuit shown in FIG. 11. On the left side of the node D in the figure as viewed from you, you can see that PMOS transistors TR1, TR2, and TR3 and also NMOS transistors TR4, TR5, and TR6 are connected in series. Out of those transistors, first the innermost transistors TR3 and TR4 are assumed to be rendered non-conducting simultaneously. Based on this assumption, the system carries out verification, to decide whether these two transistors may be rendered non-conducting simultaneously. If no conflict is encountered in this verification, the system authorizes that the node D can be of the Z state. If it is decided that the transistors TR3 and TR4 cannot be rendered non-conducting simultaneously, the system increases the number of verification steps for further verification. Assume here, by including second innermost transistors TR2 and TR5, that at least either of the transistors TR2 and TR3 and also at least either of the transistors TR4 and TR5 are non-conducting simultaneously. The system then verifies this new assumption and, if no conflict is encountered in this verification, it authorizes that the node D can be of the Z state. If this verification encounters a conflict, the system further increases the number of verification steps for further verification. This further verification involves TR1 and TR6 too. Generally, if it is not verified that a given node can be the Z state until an appropriate number of verification steps is reached, the verification is discontinued to authorize that the node is a non-Z node. However, the number of verification steps may be increased until such a node is encountered that has a power supply, ground, input signal, output signal, or other special attribute.

In order to carry out verification completely, it is of course desirable to increase the number of verification steps until a power supply etc. is encountered but will it need rather a long time that much. Therefore, it is more desirable to limit the number of verification steps to, specifically, two or three whereupon verification is to be discontinued, so that fairly good results can be obtained without deteriorating the speed of the verification process.

Thus, it is possible to authorize more transistors whose signal-flow directions can be narrowed down by increasing the number of verification steps. This enables decreasing the number of false paths contained in the output results with a shorter processing time.

On the other hand, the system authorizes a node decided to have encountered a conflict at a step S125 or S128 to be a non-Z node (step S126) and then to be the node whose signal-flow directions can be narrowed down at the subsequent steps (step S129). The system carries out this process on all the node of the relevant circuit.

Now, a step S130 is described where the directions in which the signal flows for transistors according to the above-mentioned embodiment are narrowed down. FIG. 12 shows the basic rules on which those directions are narrowed down for the transistors according to the embodiment. This embodiment employs those rules for the narrowing down of signal-flow directions for the transistors linked with any one of the non-Z nodes of FIGS. 12(*i*) through 12(*k*) as well as those rules for the conventional transistors of FIGS. 12(*a*) through 12(*h*). In the case where the source or the drain of transistor is connected to a non-Z node as shown in FIG. 12(*i*) or 12(*j*) respectively, the signal-flow direction is determined to be such as indicated by the arrow in FIG. 12(*i*) or 12(*j*) because the non-Z node can only be either a high state, i.e. connected to the power-supply terminal, or a low state, i.e. grounded, respectively in much the same way as with the case where the signal-flow directions are narrowed down for the transistors connected to the input signal such as shown in FIGS. 2(*e*) or 2(*f*).

Also, in the case where, as shown in FIG. 12(*k*), both the source and the drain of transistor are connected to a non-Z node the signal may flow in either direction, so that both directions are determined.

In the actual process of narrowing down the transistor signal-flow directions by using those rules in the same way as the conventional examples, it is possible to narrow down the directions for those transistors connected to a transistor whose signal-flow directions have already been narrowed down.

Subsequently, a step S140 for dividing each sequential circuit into block units would actually divide it if possible.

The next step S150 for path searching may be considered to have the same algorithm as that for the conventional path search technique and, its description is omitted here.

Figure 13:
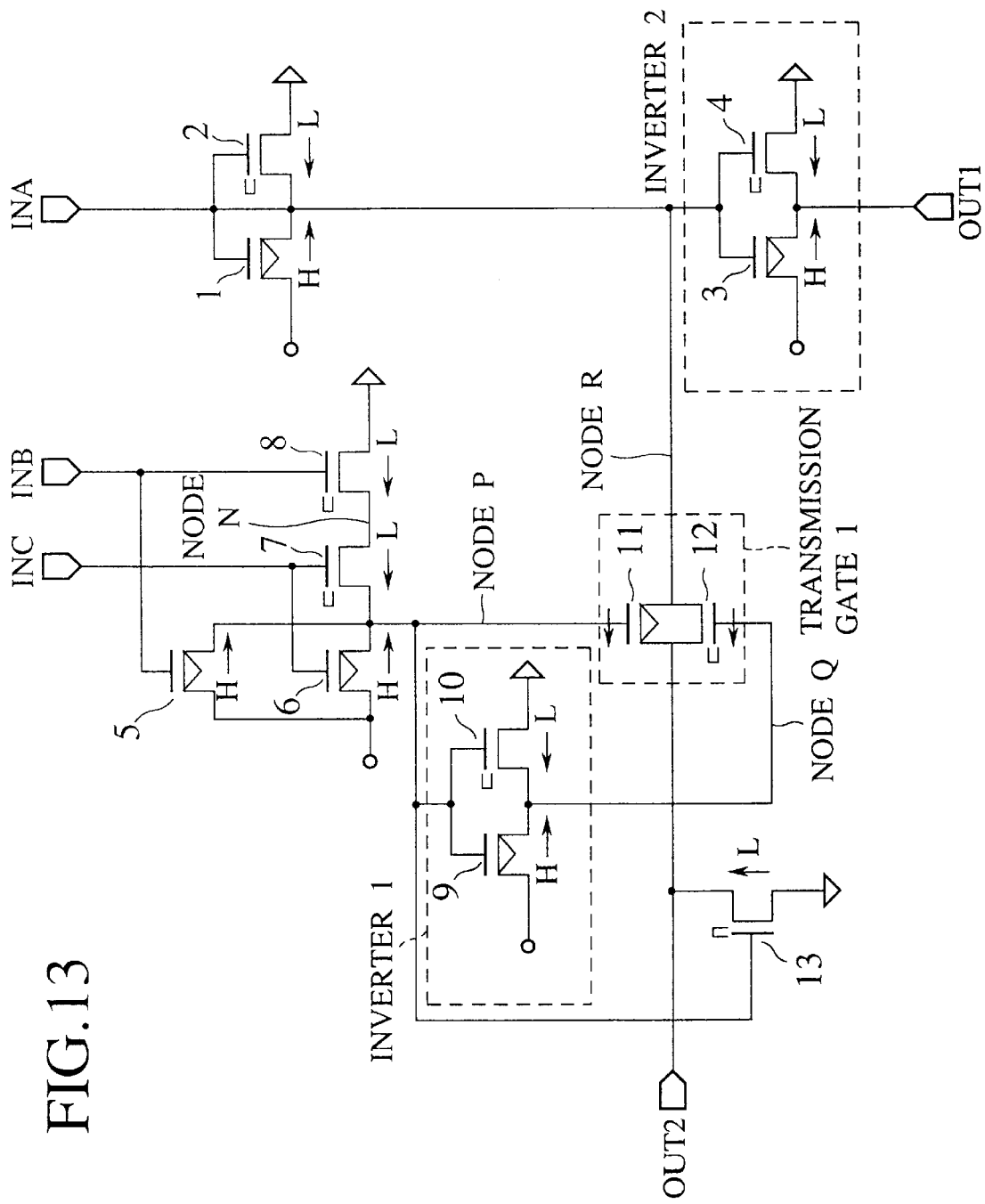
FIG. 13 is a circuit diagram (of a test circuit) for analysis according to the embodiment.

The technique of the embodiments is described on the basis of the analysis of a circuit prepared for evaluation. FIG. 13 shows the circuit to be analyzed.

First, the system carries out a non-Z node check. Although, as mentioned earlier, the system needs to check all the nodes, it checks here whether a node R for example is a non-Z node. To the node R, as shown in FIG. 13, are connected the PMOS transistor 1 and NMOS transistor 2 and also the PMOS transistor 11 and NMOS transistor 12 which constitute a transmission gate 1. If those elements are all assumed to be rendered non-conducting simultaneously, a conflict is surely encountered because the same signal is applied to the gate of the PMOS transistor 1 and also to that of the NMOS transistor 2, and these two transistor cannot be rendered non-conducting simultaneously. Therefore, the node R is a non-Z node. Generally, the output terminal of an inverter, NAND gate, NOR gate, or other composite gate is a non-Z node. Hereinafter, it can be likewise understood that nodes P and Q are also non-Z nodes in a circuit shown in FIG. 13.

Next, the transistor signal-flow directions are determined as indicated by the arrows for the PMOS transistors 1, 3, 5, 6, and 9 and the NMOS transistors 2, 4, 7, 8, 10, and 13, based on the rules of FIGS. 12(a) through 12(h). Moreover, based on the rules of FIGS. 12(i) and 12(j), the other signal-flow directions are also determined as indicated by the arrows in FIG. 13 because the PMOS transistor 11 and NMOS transistor 12 which constitute the transmission gate (pass transistor) 1 are connected to the node R, which is a non-Z node. With this, all the transistor signal-flow directions shown in FIG. 13 can be determined.

Next, the system searches necessary paths. The paths are searched for both of a transition that the relevant signal has changed from a high state to a low state and that it has changed vice versa.

Here, paths are searched, for example, for the case where the input signal INB has changed from a low state to a high state. Assume that when the input signal has changed from the low state the high state, a sequential search causes the the node N's state to change high-to-low and then the node P' state to change high-to-low. Then, according to the direct condition, the state of the input signal INC must be a high state at least immediately after it has changed, i.e. the transition must be X→H in state, where X means a don't-care state or an undecided state. A next assumption that a further sequential search has caused the node Q's state to change low-to-high is assured without being verified. Note here that according to the conventional technique it cannot be known whether the signal flows from the node R to the output signal terminal OUT2 or in the opposite direction because the signal-flow direction for the PMOS transistor 11 and NMOS transistor 12 constituting the transmission gate 11 is not determined yet, whereas according to a technique by the present invention it can be decided that the signal can flow only from the node R to the output signal terminal OUT2 because the signal-flow direction for these two transistors constituting the transmission gate 1 is already determined. Assume here that the output signal OUT2 changes low-to-high in state. This assumption is assured by a backward search because it can be known that the node R is high and the input signal INA is low in state. With this, a path search is finished in the case where the input signal INB has changed low-to-high. This path is not a false one but possible circuit operation-wise. An timing simulation based on an actual test vector output tells that this path is activated by the-correct logic.

Figure 14:
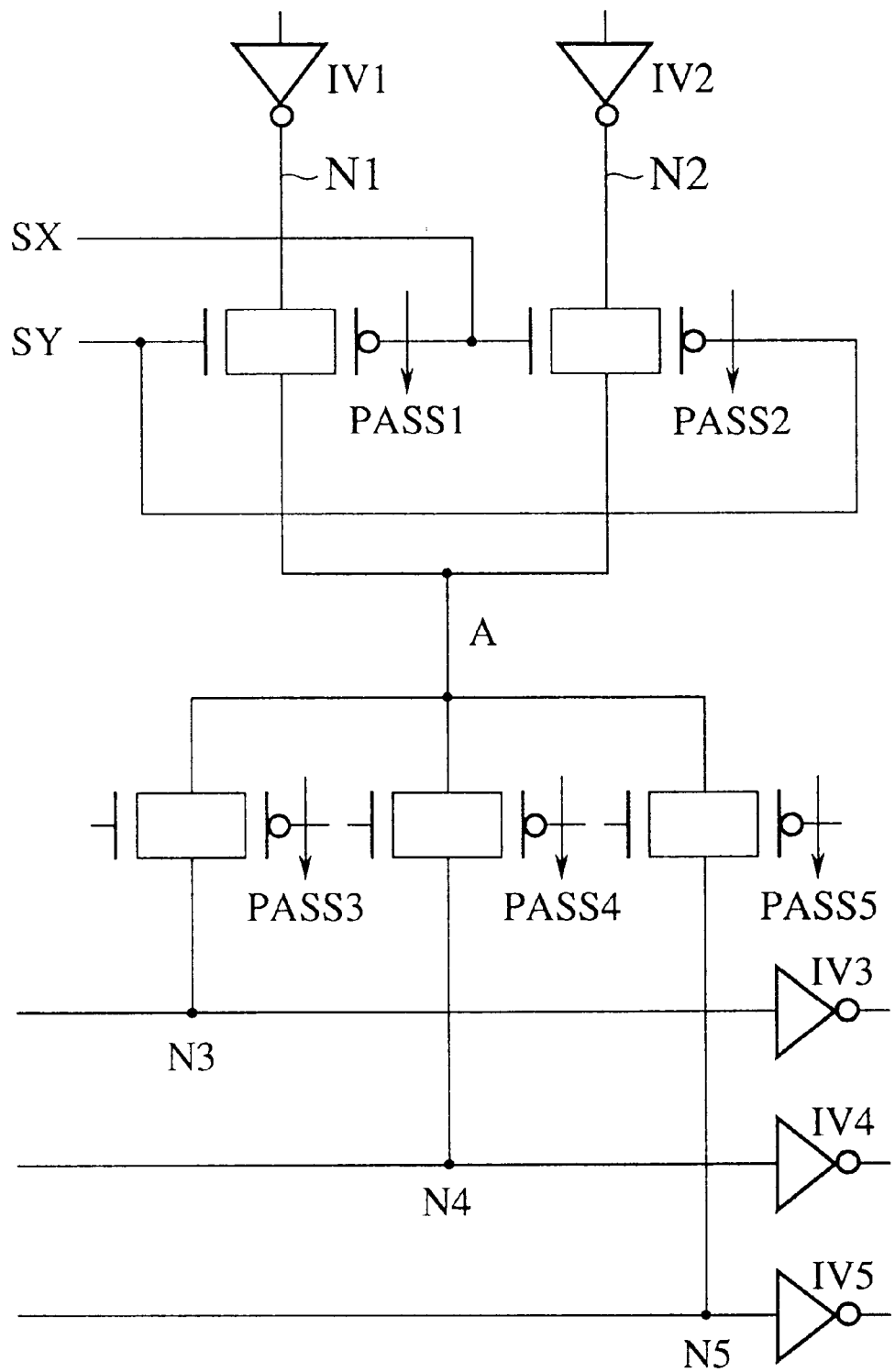
FIG. 14 is a circuit diagram (of a barrel shifter) for analysis according to the embodiment.

Next, a barrel shifter according to the embodiment is analyzed. A circuit diagram shown in FIG. 14 is the same as that shown in FIG. 3. First, non-Z nodes are checked. As described above, nodes N1 and N2 of inverters IV1 and IV2 respectively are both non-Z points. Also, assume that all of transmission gates PASS1 through PASS5 whose source or drain is linked with a node A. Note here that the PASSes 1 and 2 constitute a selector by means of signals SX and SY and so cannot be rendered non-conducting simultaneously. Therefore, the node A is a non-Z node. Nodes N3, N4, and N5 cannot be a non-Z node as far as this circuit diagram alone is seen.

Then, the process of transistor signal-flow directing according to the embodiment is described with reference to FIG. 14. In the same way as the conventional example, the directions of the signal flows for transistors constituting an inverter are determined. Moreover, a node N1 is a non-Z node, so that the directions of the signal flows for PMOS and NMOS transistors constituting a transmission gate PASS1 are determined as indicated by the respective arrows in the figure. Likewise, a node N2 is also a non-Z node, so that the directions of the signal flows for PMOS and NMOS transistors constituting a transmission gate PASS2 are determined as indicated by the respective arrows in the figure. Moreover, a node A is also a non-Z node, so that the directions of the signal flows for PMOS and NMOS transistors constituting transmission gates PASS3, PASS4, and PASS5 respectively are also determined as indicated by the respective arrows in the figure. Although it may be thought of that the signal-flow directions for the PMOS and NMOS transistors constituting the transmission gate PASS1 cannot be narrowed down because the nodes N1 and A are also non-Z nodes, it is still possible to narrow them down appropriately as described above by defining beforehand that the non-Z nodes of the output of inverters, NAND gates, NOR gates, and composite gates are higher than the other non-Z nodes in priority order of narrow-down of transistor signal-flow directions. Thus, the directions of signal flows for all the transistors shown in FIG. 14 can be determined.

Figure 1:
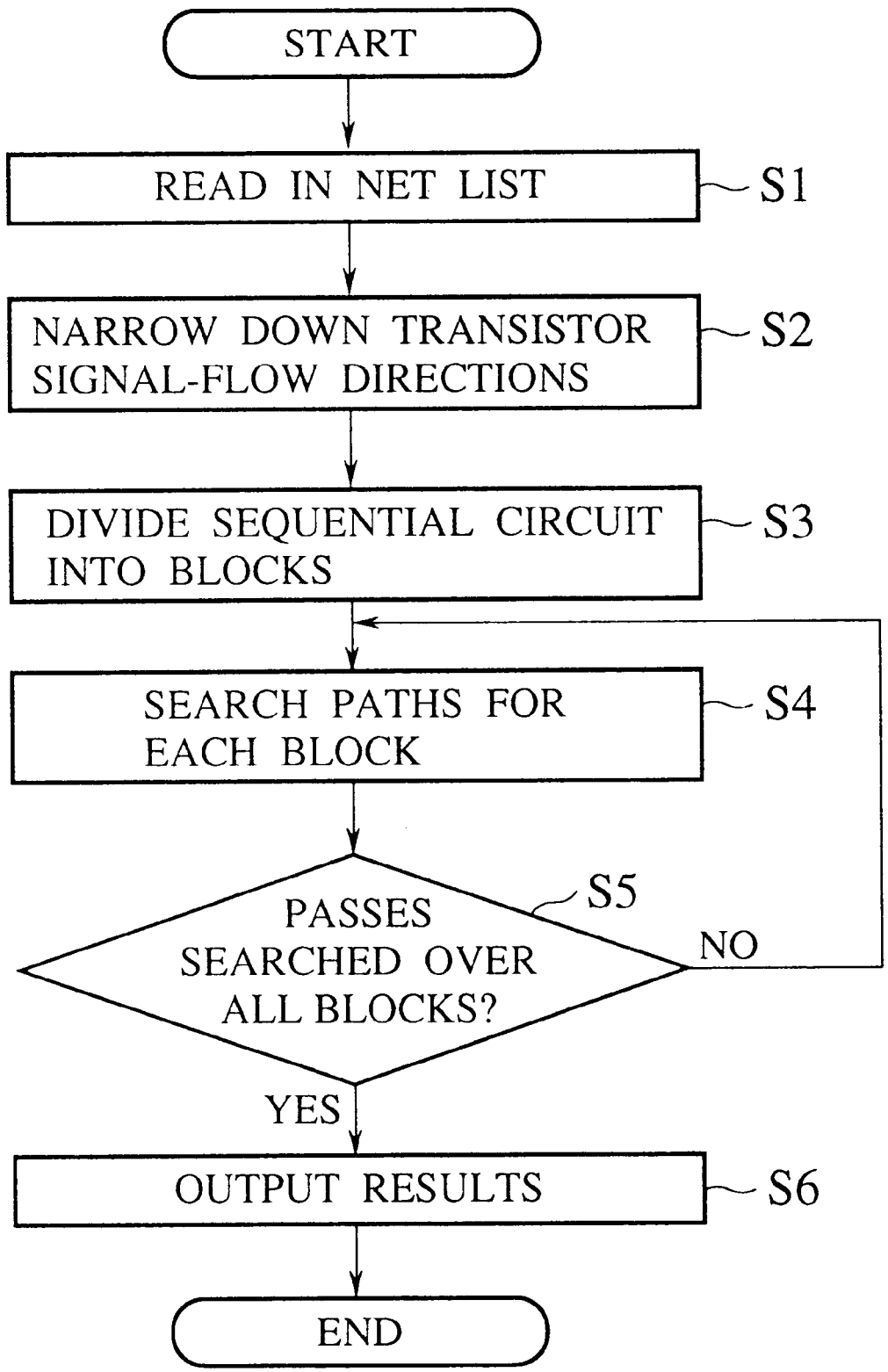
FIG. 1 is a flowchart illustrating a static-timing analysis method according to a conventional example.
Figure 3:
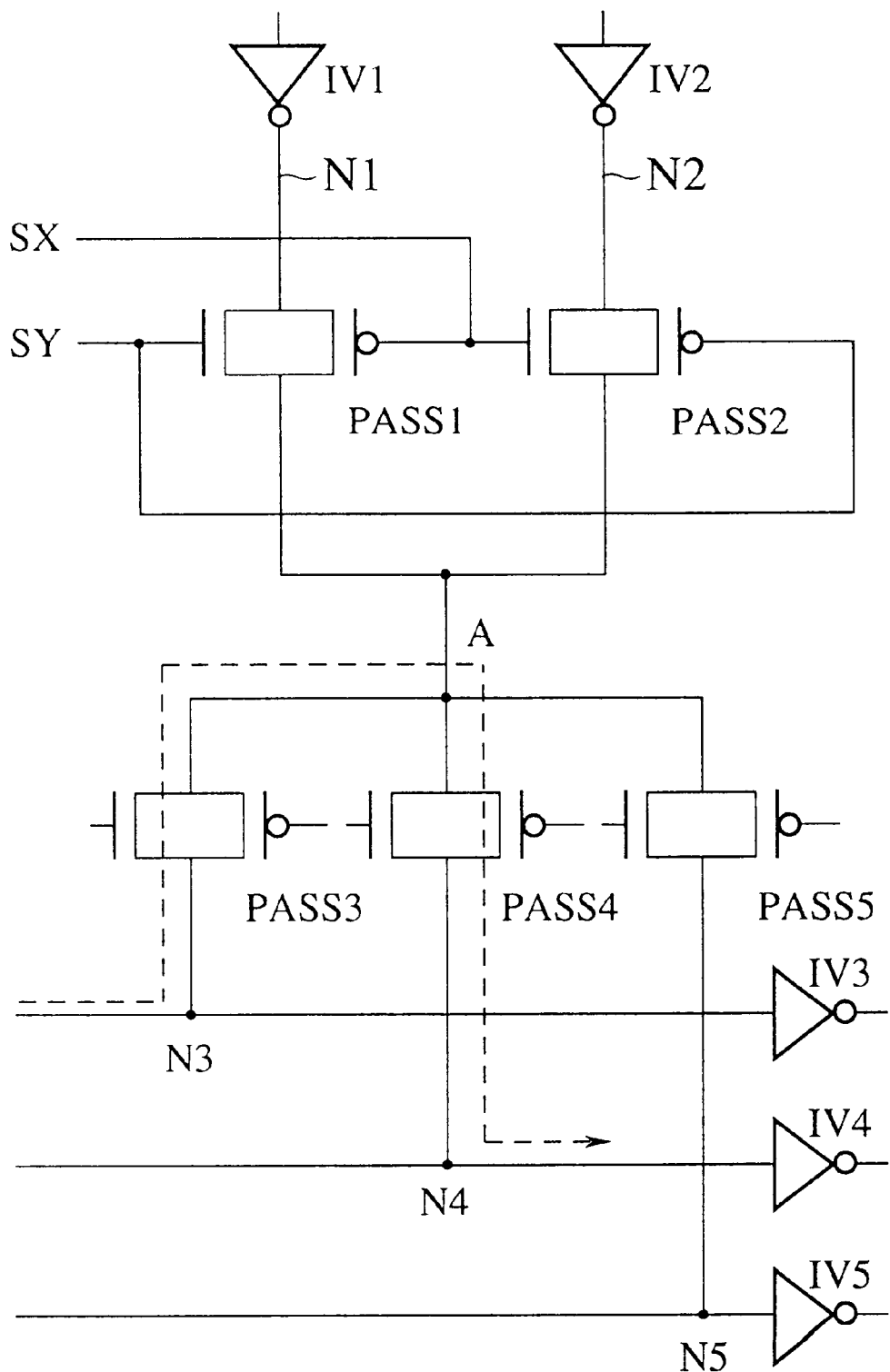
FIG. 3 is a circuit diagram (of a barrel shifter) for analysis according to the conventional example.
Figure 4:
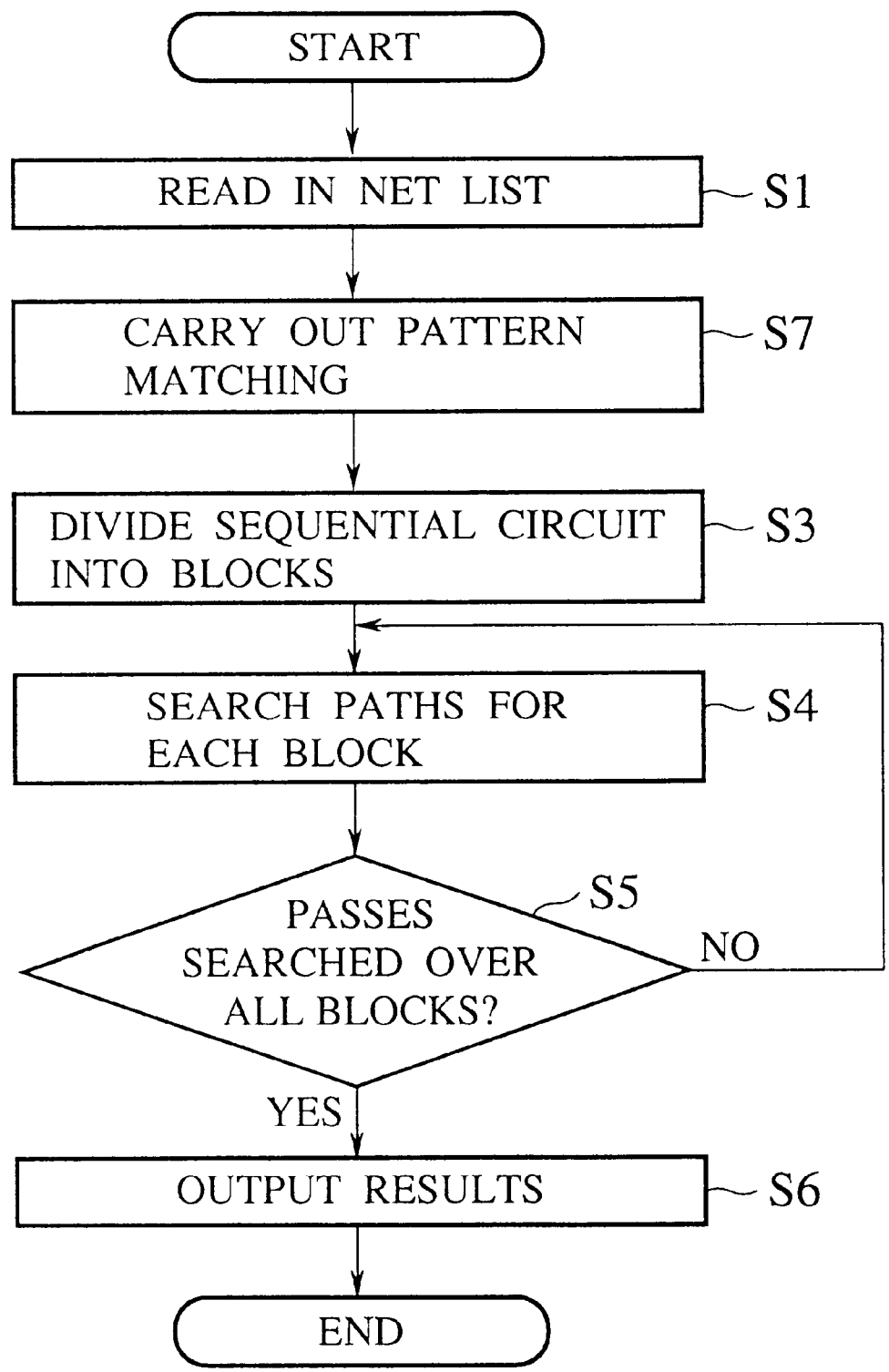
FIG. 4 is a flowchart illustrating the static-timing analysis method according to another conventional example.

The subsequent path search needs not involve any paths indicated by the broken line in FIG. 3 and ascribed to an analysis by the conventional example which are impossible circuit operation-wise, thus greatly reducing the processing time required. Also, the number of false paths to be output can be reduced.

Thus, the present embodiment greatly reduces the processing time as well as the false path output. These advantages make it easy to detect critical paths in the circuit, reducing the time required for designing and improving the design efficiency.

Note that the present invention is independent of the path-search algorithm described in the above-mentioned embodiment and so can be utilized in any static-timing analysis system which carries out an analysis on a per-transistor basis.

As described above, the present invention will provide a system and a method for analyzing the static timing which reduces false paths contained in the output results as well as the processing time required.

The foregoing description of preferred embodiments has been presented for purposes of illustrating and description. It is not intended to be exhaustive or to limit the invention to the precise form described, and obviously many modifications and variations are possible in light of the above teachings. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A static-timing analysis system for integrated circuits (ICs) which outputs potential critical paths based on transistor-connection information, comprising:

a processor; and a computer readable medium coupled to said processor having computer program logic recorded thereon for enabling the processor to perform static-timing analysis, said computer program logic comprising:

net-list input means for enabling the processor to input a net list of per-transistor basis connection information and construct an internal data structure for analysis;

expected-value check means for enabling the processor to check one or more nodes of said integrated circuits and extract those of said nodes whose expected values cannot be a high-impedance state from among those of said nodes contained in said internal data structure;

narrow-down means for enabling the processor to narrow down directions in which a signal may flow, based on information obtained by said expected-value check means;

path search means for enabling the processor to search potential critical paths with reference to the directions narrowed down in which the signal may flow; and output means for enabling the processor to output paths which have been searched by said path search means.

2. The static-timing analysis system as claimed in claim 1 wherein said expected-value check means comprises:

element search means for enabling the processor to search for all elements of said integrated circuits whose source or drain is linked with each of said nodes to be checked by said expected-value check means;

conflict decision means for enabling the processor to detect a possible conflict between values taken at each, of said nodes checked by said expected-value check means when it is assumed that thus searched elements are all rendered non-conducting simultaneously; and node authorization means for enabling the processor to perform a signal-flow direction narrow-down operation which authorizes nodes decided to have a conflict by said conflict decision means as those that cannot be a high-impedance state.

3. The static-timing analysis system as claimed in claim 2 wherein said conflict decision means further enables the processor to detect a possible conflict between values taken at nodes upstream of said searched elements for those of said nodes which are decided to have no conflict when said searched elements are all assumed to be rendered non-conducting simultaneously.

4. The static-timing analysis system as claimed in claim 3 wherein said conflict decision means enables the processor to discontinue detection after iteration of going upstream for two or more times.

5. The static-timing analysis system as claimed in claim 1 wherein said narrow-down means enables the processor to narrow down directions of only those signals sent from those of said nodes which cannot be a high-impedance state, for each relevant transistor.

6. The static-timing analysis system as claimed in claim 1, further comprising:

division means for enabling the processor to separate constituent combinational circuits from said net list of said integrated circuits, said paths being searched within each of said constituent combinational circuits.

7. A static-timing analysis method for ICs which outputs potential critical paths based on transistor-connection information, comprising:

a net-list input step which inputs a net list of per-transistor basis connection information, to construct an internal data structure for analysis;

an expected-value check step which checks one or more nodes of said integrated circuits and extracts those of said nodes whose expected values cannot be a high-impedance state from among those of said nodes contained in said internal data structure;

a signal-flow direction narrow-down step which narrows down directions in which transistor signals flow, based on information obtained by said expected-value check step;

a path search step which searches potential critical paths with reference to directions narrowed down in which a signal may flow; and an output step which outputs paths which have been searched by said path search step.

8. The static-timing analysis method as claimed in claim 7 wherein said expected-value check step comprises:

an element search step which searches for all elements of the ICs whose sources or drain is linked with each node to be checked by said expected-value check step;

a conflict decision step which detects a possible conflict between values taken at each of said nodes checked by said expected-value check step when it is assumed that those searched elements are all rendered non-conducting simultaneously; and a node authorization step which authorizes nodes decided at said conflict decision step to have a conflict as those of said nodes for which signal-flow directions can be narrowed down.

9. The static-timing analysis method as claimed in claim 8 wherein said conflict decision step further detects a possible conflict between values taken at nodes upstream of said searched elements for nodes decided to have no conflict when it is assumed that said searched elements are all rendered non-conducting simultaneously.

10. The static-timing analysis method as claimed in claim 9 wherein said conflict decision step discontinues detection after iteration of going upstream for two or more times.

11. The static-timing analysis method as claimed in claim 7 wherein said signal-flow direction narrow-down step narrows down the directions of only those signals sent from nodes which cannot be a high-impedance state, for relevant transistors.

12. The static-timing analysis method as claimed in claim 7, further comprising:

a division step which separates constituent combinational circuits from said net list of said integrated circuits, said paths being searched within each of said constituent combinational circuits.

13. A computer program product comprising a computer useable medium having computer program logic recorded thereon for enabling a processor in a computer system to perform static-timing analysis of an integrated circuit (IC), said computer program logic comprising:

means for enabling the processor to input a net list of per-transistor basis connection information to construct an internal data structure for analysis;

means for enabling the processor to check nodes of the integrated circuit and extract those of said nodes whose expected values cannot be a high-impedance state from among those of said nodes contained in said internal data structure;

means for enabling the processor to narrow down directions in which transistor signals flow from said expected values;

means for enabling the processor to search potential critical paths with reference to the directions narrowed down in which the signal may flow; and means for enabling the processor to output paths which have been searched.

14. The computer program product as claimed in claim 13, wherein said means for enabling the processor to check nodes of the integrated circuit comprises:

means for enabling the processor to search for all elements of the IC whose source or drain is linked with each node to be checked by said means for enabling the processor to check nodes of the integrated circuit;

means for enabling the processor to detect a possible conflict between values taken at each of said nodes checked by said means for enabling the processor to check nodes when an assumption is made that said searched elements are all rendered non-conducting simultaneously; and means for enabling the processor to perform a signal-flow direction narrow-down operation which authorizes those of said nodes determined to have a conflict as nodes that cannot be a high-impedance state.

15. The computer program product as claimed in claim 14, wherein said means for enabling the processor to detect a possible conflict further enables the processor to detect a possible conflict between values taken at nodes upstream of said searched elements for nodes which are detected to have no conflict when an assumption is made that said searched elements are all rendered non-conducting simultaneously.

16. The computer program product as claimed in claim 15, wherein said means for enabling the processor to detect a possible conflict further enables the processor to discontinue detection after iteration of going upstream for two or more times.

17. The computer program product as claimed in claim 13, wherein said means for enabling the processor to perform a signal-flow direction narrow-down operation enables the processor to narrow down the directions of only those signals sent from those of said nodes which cannot be a high-impedance state, for each relevant transistor.

* * * * *